United States Patent [19]
Reddy

[11] Patent Number: 4,789,845
[45] Date of Patent: Dec. 6, 1988

[54] BROAD BAND HYBRID SIGNAL SPLITTER

[76] Inventor: Prabhakara Reddy, 302 Mott Rd., Fayetteville, N.Y. 13066

[21] Appl. No.: 145,890

[22] Filed: Jan. 20, 1988

[51] Int. Cl.[4] ............................................... H03H 7/48
[52] U.S. Cl. ..................................... 333/100; 333/119; 333/131
[58] Field of Search ................. 333/100, 112, 119, 131

[56] References Cited

U.S. PATENT DOCUMENTS

| | | |
|---|---|---|
| Re. 19854 | 2/1936 | Amy et al. |
| 2,947,952 | 8/1960 | Hughes . |
| 3,349,345 | 10/1967 | Winegard . |
| 3,413,574 | 11/1968 | Schroeder .................... 333/119 X |
| 3,428,920 | 2/1969 | Oleksiak . |
| 3,452,401 | 6/1969 | Cappucci et al. . |
| 3,454,905 | 7/1969 | Winegard . |
| 3,500,252 | 3/1970 | Wakker . |
| 3,673,517 | 6/1972 | Ticknor . |
| 3,766,499 | 10/1973 | Dillenberger ................ 333/112 |
| 4,042,887 | 8/1977 | Mead et al. ................... 333/112 X |
| 4,173,742 | 11/1979 | Lehmann ...................... 333/100 |
| 4,207,544 | 6/1980 | Klostermark . |
| 4,264,827 | 4/1981 | Herzog . |
| 4,275,365 | 6/1981 | Ando . |
| 4,467,293 | 8/1984 | Apel . |

FOREIGN PATENT DOCUMENTS

| | | | |
|---|---|---|---|
| 2448789 | 4/1976 | Fed. Rep. of Germany | 333/112 |
| 2807327 | 12/1978 | Fed. Rep. of Germany | 333/131 |

*Primary Examiner*—Paul Gensler
*Attorney, Agent, or Firm*—Wall and Roehrig

[57] ABSTRACT

A signal splitter connects a radio frequency signal source to a pair of output loads, e.g., separate receivers, and has an increased high-end frequency response as compared to similar devices. First and second tubular cores are disposed side by side, each with a pair of toroidal windings therein. An input end of the first winding of the first core is coupled to the signal input and the second end of the second winding to ground, respectively, while output ends of the windings in the second core are connected to the output loads. The other ends of the windings of the two cores are respectively connected to one another to form two single-pair twisted connections. These are passed into through holes of a printed circuit board and are soldered or otherwise electrically connected to a printed conductor on the board. This construction reduces stray inductance significantly and also provides better mechanical mounting than previous devices. The two tubular cores could be fused as a single core with two holes.

5 Claims, 1 Drawing Sheet

U.S. Patent    Dec. 6, 1988    4,789,845 ental frequency response to about 600 MHz.

BROAD BAND HYBRID SIGNAL SPLITTER

BACKGROUND OF THE INVENTION

This invention relates to electrical signal coupling devices, and more specially to a signal splitter for use with radio frequency signals in the hf, vhf and/or uhf bands. The invention is more specifically directed to an improved coupling device which can be used for TV signals over the entire band of television broadcast and cable channels, to wit, in the 5 MHz to 1000 MHz range.

Generally, a line splitter is a device for connecting a signal input source to a plurality of signal output transmission paths, which can be coaxial cables destined for separate RF or television receivers. The line splitter is intended not only to match the input to output impedances, but also to isolate the output branch transmission paths from one another.

A number of line-splitters or signal-splitters have been previously proposed, for example, in U.S. Pat. Nos. 3,454,905; 3,349,345; 3,673,517; and 3,500,252. These signal splitters are typically autotransformers that have one or more ferromagnetic cores with a pair of windings formed on each core. One pair of windings is considered an input or impedance-matching device, and the other with its associated core is considered an output or splitting device.

In state-of-the-art splitters, the windings are formed of wires that pass through and around the cores to form toroidal windings of one or more turns. Typically, four bare-wire ends, one from each of the four windings, are twisted together to form a single junction. The other ends of the wire coils or windings are connected to a signal input and to ground, and first and second signal outputs.

Because this junction has four wire ends bundled or twisted together, rather long leads are required. There has been no means proposed to avoid the band-width limiting disadvantage of long leads from the splitter coils and impedance matching coils.

OBJECTS AND SUMMARY OF THE INVENTION

It is an object of this invention to provide a simplified signal-splitter which avoids drawbacks of the prior art.

It is another object of this invention to provide a hybrid signal splitter which has a pass band that is increased by about 400 MHz, but without increasing the number of components and while keeping free of complexity of construction.

It is yet another object of this invention to provide an autotransformer with increased structural integrity.

In accordance with an aspect of this invention, a signal-splitter is provided to couple an hf, vhf, or uhf source to a pair of loads, each of a predetermined impedance. First and second tubular cores are disposed radially side by side. First and second toroidal coils or windings are formed on the first core, each including at least one turn, and each having a first end and a second end. Third and fourth toroidal coils or windings are formed on the second core, and each of these includes at least one turn and has a first end and a second end. The second end of the first winding is twisted with the second end of the third winding to form one twisted connection, and the first end of the second winding is twisted together with the first end of the fourth winding to form another twisted connection. A signal input connects the first end of the first winding to a signal input source, and a signal ground is coupled to the second end of the second winding. First and second signal outputs respectively couple the first ends of the third and second end of the fourth windings to the respective output loads. A printed circuit board on which the cores are mounted has a pair of spaced apart through-holes and a printed conductor formed thereon extending between the through-holes. The first and second twisted connections pass through these holes and are soldered to the printed conductor. This feature provides an electrical connection and also secures the cores and windings to the board.

With this construction, the lengths of the free ends of the windings can be shortened considerably from those of the devices of the prior art. This extends the bandpass response of the system by about 400 MHz. Further, the devices provide superior performance for spliting of TV or RF signals for service to a number of separate receivers, and provide excellent isolation.

The above and many other objects, features, and advantages of this invention will be more fully understood from the ensuing description of a preferred embodiment which should be considered in connection with the accompanying drawing.

DETAILED DESCRIPTION OF A PREFERRED EMBODIMENT

Figure 1:
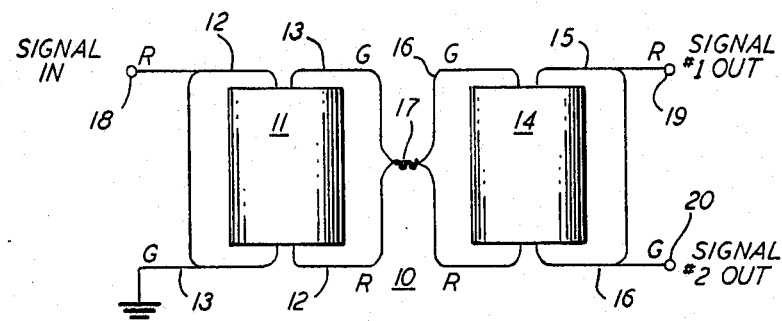
FIG. 1 is a sectional view of a signal-splitter according to the prior art.

Prior to the description of the exemplary embodiment, a signal-splitter device 10 according to the prior art will be described with reference to FIG. 1. This description is presented for the purposes of emphasizing the advantages of this invention.

The prior-art device 10 has a cylindrical ferrite core 11 serving as an input impedance matching transformer and having a pair of helical windings 12 and 13 formed thereon. Another cylindrical core 14 serving as an output or splitter transformer has a pair of helical windings 15 and 16 formed on it. For purposes of identifying wires, the windings 12 and 15 have insulation colored red while the windings 13 and 16 have insulation colored green. Free ends of each of the four windings 12, 13, 15 and 16 are twisted together to form a twisted connection 17 between the two cores 11 and 14. A signal input 18 couples the first winding 12 to a signal source, which can be a coaxial cable or other signal feed. The other end of the winding 13 of the first core 11 is grounded. The other ends of the signal splitter windings 15 and 16 are each connected to a respective signal output 19 and 20, which supply an output signal to first and second output loads.

The twisted connection 17, which joins the ends of four separate wire coils, requires more wire length than would be needed for two separate two-wire twists. The extra wire length in this prior-art device limits the top end of the frequency passband, as compared to the device of this invention, to be described below.

Figure 2:
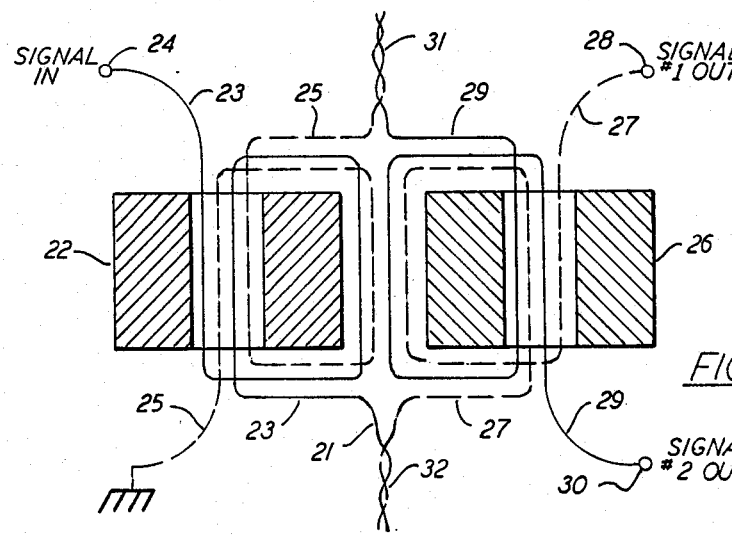
FIG. 2 is a sectional view of a signal-splitter according to one embodiment of this invention.
Figure 3:
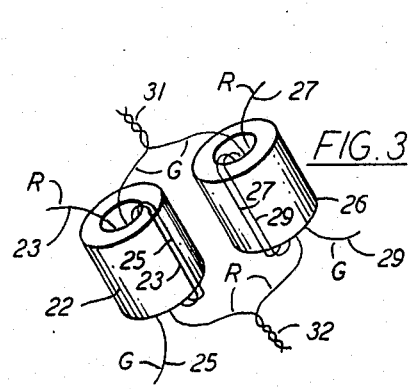
FIG. 3 is a perspective view of the splitter of this embodiment.

An autotransformer 21 according to the present invention is arranged as shown in FIGS. 2 and 3. A first core 22 of cylindrical ferrite has a first helical winding 23 that has a free end connected to a signal input 24, and a second helical winding 25 which has a free end connected to ground. A second core 26 of cylindrical ferrite is disposed radially side by side with the first core 22, and has a helical winding 27 which is connected to a first signal output terminal 28, and a second helical winding 29 which is connected to a second output terminal 30. The other free end of the winding 25 and the corresponding free end of the winding 29 are twisted together to form one twisted connection 31, while the other end of the windings 23 and 27 are twisted together to form another twisted connection 32. A considerable amount of wire length is saved here as compared with the configuration of FIG. 1, because these connections terminate at ends of the cylindrical or tubular cores 22 and 26, and need not extend back axially to a mid plane of the cores in order to keep it symmetrical as in the prior-art devices.

Here, each winding consists of two turns that extend through the hole in the core and once around the outside of the respective cores 22, 26. In other specific applications other configurations could be used.

Figure 4:
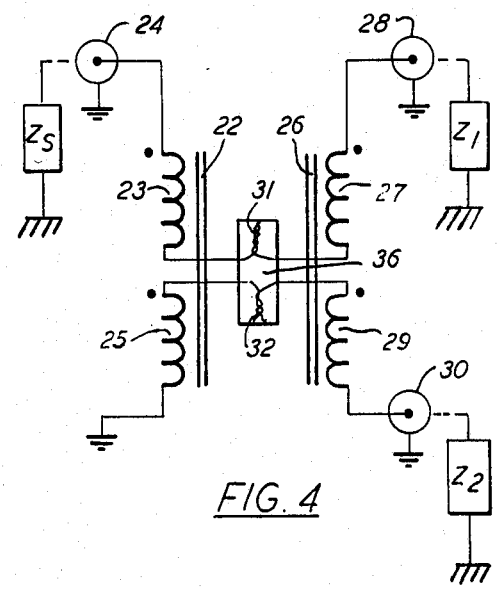
FIG. 4 is a schematic circuit equivalent of this embodiment of the invention.
Figure 5:
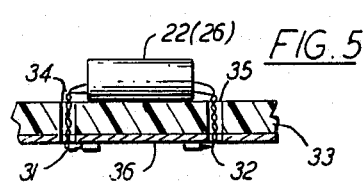
FIG. 5 is a sectional elevation of the splitter mounted on a printed circuit board.

As shown in FIGS. 4 and 5, the input terminal 24 is connected to a source having a predetermined input source impedance $Z_s$, and the output terminals 28 and 30 are assumed to be coupled to devices having predetermined output impedances $Z_1$ and $Z_2$. The relative number of turns in the windings 23, 25, 27, and 29 can be selected to match these impedances $Z_s$, $Z_1$ and $Z_2$. However, in a cable television environment, the impedances can all be assumed to be equal, typically 75 Ohms.

As shown more particularly in FIG. 5, both cores 22, 26 and their windings are affixed onto a printed circuit board 33 that is provided with a pair of through-holes 34 and 35. The respective twisted connections 31 and 32 are inserted through these holes and are soldered to contact pads of a printed conductor 36 on the reverse side of the board and extending between these two through-holes 34 and 35.

As aforementioned, the reduced wire length in this invention provides enhanced higher frequency response and reduces stray inductance. Devices of this invention have been found to have a quite flat frequency response over a wide frequency range.

It should also be mentioned that the windings need not be copper wire, but can be formed of sheet metal, as described in U.S. Pat. No. 3,500,252. Also, the cores 22 and 26 need not be separate elements but can be formed unitarily.

While the invention has been described with reference to a single preferred embodiment, the invention is not limited to that embodiment. Rather, many modifications and variations thereof would present themselves to those skilled in the art without departing from the scope and spirit of this invention as defined in the appended claims.

What is claimed is:

1. A signal-splitter for coupling an hf, vhf or uhf source to a pair of loads that have a predetermined impedance, comprising:
   first and second tubular cores disposed radially side by side;
   first and second wire toroidal windings formed on the first core each including at least one turn and having a first end and a second end;
   third and fourth wire toroidal windings wound on the second core each including at least one turn and having a first end and a second end;
   the second end of the first winding being twisted together with the second end of the third winding to form a first twisted connection;
   the first end of the second winding being twisted together with the first end of the fourth winding to form a second twisted connection;
   a signal input terminal for connecting the first end of the first winding to a signal input source;
   a signal ground coupled to the second end of the second winding;
   first and second signal outputs for respectively coupling the first end of the third and second end of the fourth winding to respective output loads; and
   a printed circuit board that includes a pair of spaced through holes and a printed conductor thereon extending between them;
   said first and second twisted connections passing through said holes to secure the cores and windings to the board and being electrically connected with said printed conductor.

2. A signal splitter according to claim 1 wherein said cores are hollow ferrite cylinders.

3. A signal splitter according to claim 1 wherein said first through fourth windings have respective numbers of turns selected to match the input impedance of the input source to the respective impedances of the output loads.

4. A signal splitter according to claim 1 in which the first and second twisted connections are formed at axially opposite ends of the side-by-side cores.

5. A signal splitter according to claim 1 in which said first and second twisted connections are soldered to the printed conductor.

* * * * *